United States Patent
Uesaka

(10) Patent No.: US 8,999,510 B2
(45) Date of Patent: Apr. 7, 2015

(54) METAL-CLAD PHENOLIC RESIN LAMINATE

(75) Inventor: Masao Uesaka, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 409 days.

(21) Appl. No.: 13/121,867

(22) PCT Filed: Sep. 28, 2009

(86) PCT No.: PCT/JP2009/066797
§ 371 (c)(1), (2), (4) Date: Mar. 30, 2011

(87) PCT Pub. No.: WO2010/038703
PCT Pub. Date: Apr. 8, 2010

(65) Prior Publication Data
US 2011/0183564 A1  Jul. 28, 2011

(30) Foreign Application Priority Data

Oct. 3, 2008  (JP) ................................ 2008-258830
Oct. 30, 2008 (JP) ................................ 2008-279052

(51) Int. Cl.
| | |
|---|---|
| *B32B 27/42* | (2006.01) |
| *B32B 15/08* | (2006.01) |
| *B32B 17/04* | (2006.01) |
| *B32B 27/04* | (2006.01) |
| *B32B 29/02* | (2006.01) |
| *H05K 1/03* | (2006.01) |
| *H05K 3/02* | (2006.01) |

(52) U.S. Cl.
CPC .............. *B32B 27/42* (2013.01); *B32B 15/08* (2013.01); *B32B 17/04* (2013.01); *B32B 27/04* (2013.01); *B32B 29/02* (2013.01); *H05K 1/036* (2013.01); *H05K 1/0366* (2013.01); *H05K 3/022* (2013.01); *H05K 2201/0284* (2013.01); *Y10S 428/901* (2013.01)

(58) Field of Classification Search
USPC ................. 428/901, 416–417; 442/230–232
See application file for complete search history.

(56) References Cited

U.S. PATENT DOCUMENTS 4,803,115 A * 2/1989 Fushiki et al. ................ 442/234
2008/0036097 A1 * 2/2008 Ito et al. ........................ 257/778

FOREIGN PATENT DOCUMENTS

| CN | 87 2 14958 U | 10/1988 | |
|---|---|---|---|
| JP | 59-64616 A | 4/1984 | |
| JP | 61-255850 A | 11/1986 | |
| JP | 62-56137 A | 3/1987 | |
| JP | 63-39332 A | 2/1988 | |
| JP | 4-364941 A | 12/1992 | |
| JP | 10-279645 A | 10/1998 | |
| JP | H-10279715 A | 10/1998 | |
| JP | 2000280432 | * 10/2000 | ............. B32B 27/42 |
| JP | 2003-286387 A | 10/2003 | |
| JP | 2005-290144 A | 10/2005 | |

OTHER PUBLICATIONS

International Search Report, PCT/JP2009/066797, Dec. 8, 2009.
Office Action issued Jan. 4, 2013, in Chinese Patent Application No. 200980135736.7.
English Translation of JP 2000-280432A issued Oct. 10, 2010, prepared by the European Patent Office.
English Translation of Table 1 of JP 2000-280432A issued Oct. 10, 2010.

* cited by examiner

*Primary Examiner* — Lynda Salvatore
(74) *Attorney, Agent, or Firm* — Birch, Stewart, Kolasch & Birch, LLP

(57) ABSTRACT

A metal-clad phenolic resin laminate obtained by heating and pressing a lamination which comprises: (i) a central layered portion comprising one paper base prepreg which is made of a paper base impregnated with a first phenolic resin composition containing a resol-based resin, or a predetermined number of the paper base prepregs laid on each other; (ii) outer layered portions laid on an upper and a lower sides of the central layered portion, in which each of the outer layered portions comprises one glass fiber substrate prepreg which is made of a glass fiber substrate impregnated with a second phenolic resin composition containing a resol-based resin, or a predetermined number of the glass fiber substrate prepregs laid on each other; and (iii) a metal foil laid at least on one of the outer layered portions laid on the upper and lower sides of the central layered portion.

7 Claims, No Drawings

METAL-CLAD PHENOLIC RESIN LAMINATE

TECHNICAL FIELD

The present invention relates to metal-clad phenolic resin laminates.

BACKGROUND ART

Paper base phenolic resin laminates are widely used as substrates for printed circuits mounted on electronic devices and so on. However, such paper base phenolic resin laminates or laminates having a composite structure, in which a paper base phenolic resin being a core material is disposed between glass fiber substrates impregnated with an epoxy resin (Patent Literature 3) have had problems in water absorption rate and mechanical strength.

Alternative materials thereof are paper base epoxy resin laminates or laminates having a composite structure, in which a paper base epoxy resin prepreg being a core material is disposed between glass fiber substrates impregnated with an epoxy resin. However, they have been insufficient in electrical properties, particularly, long-term hygroscopicity and electric insulation required for printed-circuit boards (Patent Literatures 1 and 2). Also, when printed-circuit boards are used under high voltage, it is required to prevent a fire due to occurrence of tracking. However, the paper base epoxy resin laminates or the laminates having a composite structure, in which a paper base epoxy resin prepreg being a core material is disposed between glass fiber substrates impregnated with an epoxy resin have problems that the tracking resistance of actual printed-circuit boards is low and there is restriction in circuit design. Hence, phenolic resin laminates having a combination of requirements such as electrical properties, mechanical strength and tracking resistance have been desired.

[Patent Literature 1] Japanese Patent Application Laid-Open (JP-A) No. 61-255850
[Patent Literature 2] JP-A No. 62-56137
[Patent Literature 3] JP-A No. 63-39332

SUMMARY OF INVENTION

Technical Problem

The present invention has been achieved in light of the above circumstances, and provides a phenolic resin laminate having a combination of electrical properties, mechanical strength and tracking resistance.

Solution to Problem

The present invention can be achieved by the following (1) to (5).

(1) A metal-clad phenolic resin laminate obtained by heating and pressing a lamination which comprises:
(i) a central layered portion comprising one paper base prepreg which is made of a paper base impregnated with a first phenolic resin composition containing a resol-based resin, or a predetermined number of the paper base prepregs laid on each other;
(ii) outer layered portions laid on an upper and a lower sides of the central layered portion, in which each of the outer layered portions comprises one glass fiber substrate prepreg which is made of a glass fiber substrate impregnated with a second phenolic resin composition containing a resol-based resin, or a predetermined number of the glass fiber substrate prepregs laid on each other; and
(iii) a metal foil laid at least on one of the outer layered portions laid on the upper and lower sides of the central layered portion.

(2) The metal-clad phenolic resin laminate according to (1), wherein the metal foil of the lamination is a metal foil with an adhesive, and a surface with the adhesive and a surface of the glass fiber substrate prepreg are disposed to face each other.

(3) The metal-clad phenolic resin laminate according to (1) or (2), wherein the glass fiber substrate is made of glass woven fabric.

(4) The metal-clad phenolic resin laminate according to any of (1) to (3), wherein the first phenolic resin composition constituting a first phenolic resin coating liquid and the second phenolic resin composition constituting a second phenolic resin coating liquid are the same resin composition.

(5) The metal-clad phenolic resin laminate according to any of (1) to (4), wherein long-term moisture absorption rate after being left at 60° C. and 90% relative humidity for 1,000 hours is 2 wt % or less.

Advantageous Effects of Invention

According to the present invention, a metal-clad phenolic resin laminate having machine properties, electrical properties, and tracking resistance can be provided.

DESCRIPTION OF EMBODIMENTS

Hereinafter, a metal-clad phenolic resin laminate of the present invention will be explained in more detail.

The metal-clad phenolic resin laminate of the present invention is formed by heating and pressing a lamination which comprises: (i) a core material (referred to as "central layered portion") comprising one paper base prepreg which is made of a paper base impregnated with a first phenolic resin composition prepared in liquid state (the phenolic resin composition prepared in liquid state is referred to as "phenolic resin liquid") and dried, or a predetermined number of the paper base prepregs laid on each other; (ii) outer portions (referred to as "outer layered portions") provided on an upper and a lower sides of the central layered portion, in which each of the outer layered portions comprises one glass fiber substrate prepreg which is made of a glass fiber substrate impregnated with a second phenolic resin liquid, and dried, or a predetermined number of the glass fiber substrate prepregs laid on each other; and (iii) a metal foil laid at least on one of the outer layered portions.

By laying one glass fiber substrate prepreg which is made of the glass fiber substrate impregnated with the phenolic resin composition or a predetermined number of the glass fiber substrate prepregs laid on each other on the upper and the lower sides of the core material using the paper base prepreg which is made of the paper base impregnated with the phenolic resin composition, the strength and water absorption property, which are not sufficient with a paper base phenolic resin laminate, and the long-term moisture resistance, electric insulation and tracking resistance, which are not sufficient with a paper base epoxy resin laminate or a laminate in which a paper base epoxy resin prepreg being a core material is disposed between glass fiber substrates impregnated with an epoxy resin, can be improved.

By using the glass fiber substrates on the upper and the lower sides of the core material using the paper base prepreg, the strength and water absorption rate, which are not sufficient with a paper base phenolic resin laminate, can be improved.

Further, by using the phenolic resin, the long-term moisture resistance and electric insulation can be improved. A paper base is material having a high water absorption property compared to a glass fiber substrate, and can be used as a laminate by impregnating paper fiber with a resin to suppress its water absorption property. Since paper bases are excellent in water absorption property and hydrophilic, it is desirable if the resin liquid impregnated into the paper fiber is more hydrophilic. When the water absorption properties of resins themselves are compared, an epoxy resin is superior to a phenolic resin. However, since an epoxy resin liquid has a strong hydrophobicity, the resin liquid hardly interpenetrates into paper fiber when a paper base is impregnated with the resin liquid. To the contrary, when a phenolic resin liquid is used, the resin can interpenetrate into paper fiber.

Such an effect of moisture resistance may not be clear by a short-term soaking test for laminates shown in JIS-C6481 since the infiltration rate of water is slow. However, in view of long-term hygroscopicity and saturated moisture absorption amount by pressure required for printed wiring boards being final products, using a phenolic resin liquid is superior. Also, the electric insulation of a printed board is excellent. Specifically, as for the long-term moisture resistance, an insulation test of a printed board is desirably performed at 60° C. and 90% relative humidity for 1,000 hours among general conditions including: temperature of 60° C., relative humidity of 90% and testing time of 1,000 hours; and temperature of 40° C., relative humidity of 90% and testing time of 1,000 hours, since the above condition is more severe and more obvious difference can be seen. When the moisture absorption rate is 2 wt % or more upon treatment at 60° C. and 90% relative humidity for 1,000 hours, the insulating property of a printed board decreases. The moisture absorption rate is desirably 1.5 wt % or less.

Also, tracking is phenomenon of ignition of carbide due to short circuit and heat generation. By layering the non-carbonizing glass fiber substrates on the upper and lower sides of the core material being the paper base prepreg, tracking resistance can be improved.

A method shown in UL-1410 is a general method of a tracking resistance test. When a test is conducted by the method, there may not be clear difference between a phenolic resin and an epoxy resin. However, when an actual printed board is produced and a tracking resistance test between copper circuits is conducted in accordance with UL-1410, using a phenolic resin is superior.

The detail of the composition of the phenolic resin composition used for the laminate will be hereinafter described, but an oil-modified resol-based phenolic resin is used to exhibit punching quality. Hence, the concentration of benzene rings, which do not decompose but carbonize at relatively low temperature, is low and tracking hardly occurs compared to an epoxy resin.

Hereinafter, each component will be explained in more detail.

The phenolic resin laminate of the present invention uses a paper base impregnated with a first phenolic resin composition as a core material. The core material used herein forms an intermediate layer disposed between glass fiber substrate prepregs impregnated with a second phenolic resin composition.

Both first and second phenolic resin compositions used in the present invention contain a resol-based resin. The first and second phenolic resin compositions may be the same or different resin composition. Herein, the same resin composition means that the solid content compositions of the resin compositions are the same. It is particularly preferable for the first and second phenolic resin compositions that not only the same solid content composition is used but also the same solvent is used.

The first and second phenolic resin compositions may contain a resol-based phenolic resin and a novolac-based phenolic resin. By containing the resol-based phenolic resin, impregnation properties to a paper base can be improved. Also, cost reduction of paper base phenolic resin laminates can be attained. The resol-based phenolic resin is not particularly limited. Any of resol-based phenolic resins generally used can be used.

The charging amount of the resol-based phenolic resin is not particularly limited, but is preferably 20 wt % or more, more preferably 20 wt % to 80 wt %, and even more preferably 30 to 60 wt %, with respect to the total amount (based on solid content) of the phenolic resin composition. If the charging amount of the resol-based phenolic resin is within the above range, curing of the novolac-based phenolic resin hereinafter described can be sufficient, and the heat resistance, chemical resistance and so on can be improved. Also, there is an effect of decreasing odor and so.

The resol-based phenolic resin of the present invention is not particularly limited, but preferably contains an oil-modified resol-based phenolic resin since the punching quality of the phenolic resin laminate to obtain printed boards can be improved. Examples of the oil-modified resol-based phenolic resin include dry oil-modified resol-based phenolic resins such as wood oil, linseed oil and walnut oil; and semi-dry oil-modified resol-based phenolic resins such as soybean oil, cotton oil and safflower oil. Among the above, wood oil modified resol-based phenolic resins are preferable since punching quality can be improved. Also, the charging amount of the oil-modified resol-based phenolic resin is not particularly limited, but is preferably 5 to 50 wt %, more preferably 10 to 40 wt %, with respect to the total amount (based on solid content) of the phenolic resin composition since the punching quality of the phenolic resin laminate can be further improved.

By containing the novolac-based phenolic resin, the amount of unreacted phenol and formaldehyde can be decreased. When the novolac-based phenolic resin is used, the residual amount of unreacted phenol and formaldehyde is small upon synthesis compared with using a resol-based phenolic resin. Hence, by impregnating the paper base with the phenolic resin composition, which is a mixture of the resol-based phenolic resin and the novolac-based phenolic resin, a prepreg having a small amount of unreacted phenol and formaldehyde can be obtained. As a method of removing unreacted phenol of the resol-based phenolic resin, a steam distillation method of phenolic resins is known, but is not preferable since the number of processes increases. On the other hand, in the present invention, since the phenolic resin composition in which generally unreacted product is reduced is compounded, the amount of unreacted phenol and formaldehyde can be decreased without increasing the number of processes.

Also, by using the above resol-based phenolic resin in combination, curing can be performed without using a cross-linking agent other than a phenolic resin. Further, by using the above resol-based phenolic resin and novolac-based phenolic resin in combination, the amount of powder generating upon punching the printed board can be decreased. When punching a paper base phenolic resin laminate comprising a conventional resin composition to obtain printed boards, powder of the resin composition and so on were generated from a cross-section surface after punching. Such powder affects solder wettability and connection reliability.

Examples of the novolac-based phenolic resin include phenol novolac-based resins, bisphenol A novolac-based phenolic resins, bisphenol F novolac-based phenolic resins, cresol novolac-based phenolic resins and alkyl phenol novolac-based phenolic resin. Among the above, phenol novolac-based resins, bisphenol F novolac-based phenolic resins and cresol novolac-based phenolic resins are preferable since the amount of powder generating upon punching out printed boards can be decreased.

The charging amount of the novolac-based phenolic resin is not particularly limited, but is preferably 3 to 30 wt %, more preferably 5 to 20 wt %, with respect to the total amount (based on solid content) of the phenolic resin composition. If the charging amount of the novolac-based phenolic resin is within the above range, the degree of odor and so on can be decreased and the amount of powder generating upon punching out printed boards can be decreased.

Also, a flame-retardant compound such as a halogen compound, a phosphorous compound, an amino resin or the like can be compounded within the range not contrary to the purpose of the present invention. The charging amount of the flame-retardant compound is not particularly limited, but is preferably 5 to 30 wt %, more preferably 10 to 20 wt %, with respect to the total amount (based on solid content) of the phenolic resin composition since the flame retardance can be improved without damaging characteristics of the paper base phenolic resin laminate. Examples of the halogen compound include tetrabromobisphenol A (TBBA) and TBBA-epoxy oligomer.

Examples of the phosphorous compound include phosphates, condensed phosphates and phosphine oxides. Examples of phosphate include triethyl phosphate, tributyl phosphate, triphenyl phosphate, tricresyl phosphate, cresyl diphenyl phosphate, resorcyl diphenyl phosphate and triisopropyl phenyl phosphate. They may be used alone or as a mixed system of two or more kinds. Among the above, a phosphorous compound containing one or more kinds from the group consisting of triphenyl phosphate, tricresyl phosphate and cresyl diphenyl phosphate is preferable from the viewpoint of availability.

Examples of the amino resin include melamine resins, guanamine resins and so on. Among the above, the melamine resins are preferable to increase the flame retardant effect. Amino resins are initial reactants of an amino compound such as melamine or guanamine and aldehyde such as formaldehyde, including compounds having a part or all of methylol groups etherized with a lower alcohol such as methanol, butanol or the like.

The metal foil may be a metal foil with an adhesive, and a surface with the adhesive and a surface of the glass fiber substrate prepreg may be disposed to face each other. By using the metal foil with the adhesive, the tracking resistance can be enhanced and a stable copper foil adhesion can be obtained. The adhesive is not particularly limited, but an adhesive corresponding to tracking resistance is preferable.

Next, the prepreg will be explained. The paper base and glass fiber substrate prepregs of the phenolic resin laminate of the present invention are substrates impregnated with the above phenolic resin composition. Thereby, a phenolic resin laminate having less amount of unreacted phenol and formaldehyde can be obtained. Examples of the paper base include kraft papers and linter papers. Also, the paper base of the present invention includes paper bases preliminarily treated with a water-soluble phenolic resin, a methylol melamine resin or the like.

The glass fiber substrate is not particularly limited. Glass woven fabric, glass nonwoven fabric or the like can be used. The glass woven fabric is preferable since it can have higher strength than the glass nonwoven fabric.

As a method of impregnating the substrate with the phenolic resin composition, any of generally used methods can be used. Examples of the method include a method of dipping a substrate in a resin varnish, a coating method using any of various coaters and a spraying method using a spray.

The impregnation rate of the resin in the prepreg is not particularly limited, but is generally 35 to 70 wt %. The impregnation rate of the resin in the prepreg is calculated by the following formula:

$$\text{Impregnation rate of resin in prepreg} = [(\text{weight of prepreg} - \text{weight of substrate})/\text{weight of prepreg}] \times 100$$

The number of prepreg used for the core portion and the number of prepreg layered on the upper and the lower sides of the core portion may be appropriately selected. One prepreg may be used on the core portion, or one prepreg may be laid on each of the upper and lower sides of the core portion.

When the strength of the laminate is required, two or more prepregs are layered in the core portion or on the outer sides (upper and lower sides) of the core, or in and on both of them. When the prepregs are layered, 2 to 10 prepregs are preferable, more preferably 4 to 8 prepregs, in each part.

As the conditions of layering the phenolic resin laminate of the present invention, the heating temperature is not particularly limited, but is preferably 130 to 240° C., more preferably 140 to 200° C.

Also, the above pressure to apply is not particularly limited, but is preferably 4 to 15 MPa, more preferably 7 to 12 MPa.

The pressure time is not particularly limited, but is generally 60 min. to 80 min.

EXAMPLES

Hereinafter, the present invention will be explained in more detail based on Examples and Comparative examples, but the present invention is not limited thereto. In the explanation, "%" means "wt %".

Example 1

Production of Unmodified Resol-Based Phenolic Resin

A mixture containing 1,000 g of phenol, 980 g of a 37% formaldehyde aqueous solution and 20 g of triethylamine was reacted at 60° C. for 2 hours followed by condensation under reduced pressure, and diluted with methanol. Thus, an unmodified resol-based phenolic resin varnish of 50% resin content was obtained.

Production of Novolac-Based Phenolic Resin 1,000 g of phenol and 10 g of oxalic acid were charged and heated to 100° C. followed by adding 450 g of a 37% formaldehyde aqueous solution gradually for 60 minutes. The reaction was performed at 100° C. for 1 hour with reflux. Then, atmospheric distillation was performed, and the temperature was raised to 130° C. Then, distillation under reduced pressure of 500 Pa was performed, and the temperature was raised to 190° C. followed by diluting with methanol. Thus, a novolac-based phenolic resin of 50% resin content was obtained.
Production of Oil-Modified Resol-Based Phenolic Resin 1,600 g of phenol and 1,000 g of wood oil were reacted at 95° C. for 2 hours in the presence of para-toluenesulfonic acid. Further, 650 g of paraformaldehyde, 30 g of hexamethylenetetramine and 2,000 g of toluene were added followed by reacting at 90° C. for 2 hours. Then, the resultant mixture was condensed under reduced pressure, and diluted with a mixed solvent of toluene and methanol. Thus, an oil-modified phenolic resin varnish of 50% resin content (oil-modified amount: 30%) was obtained.
(Preparation of Resin Coating Liquid for Impregnating into Paper Base and Glass Fiber Substrate)

100 parts by weight (25.6% based on solid content) of the above unmodified resol-based phenolic resin varnish, 100 parts by weight (25.6%) of the above oil-modified resol-based phenolic resin varnish, 50 parts by weight (12.8%) of the above novolac-based phenolic resin varnish, 30 parts by weight (15.4%) of brominated epoxy (product name: GX-153; manufactured by DIC Corporation), 20 parts by weight (10.3%) of triphenyl phosphate (TPP; manufactured by Daihachi Chemical Industry Co., Ltd.) and 20 parts by weight (10.3%) of a methylolized melamine resin (product name: PHENOLITE TD-2538; manufactured by DIC Corporation) were compounded. Thus, a resin coating liquid for impregnation was obtained.
(Production of Laminate)

Next, a paper base and glass woven fabric were impregnated with the above resin coating liquid for impregnation so that the impregnation rate of the resin was 55% (the rate with respect to the whole prepreg). Thus, prepregs were obtained. Six of the paper base prepregs were layered to form a core material. On each of the upper and lower sides of this core material, the glass woven fabric prepreg was laid. Further, a copper foil with an adhesive (product name: FGM; manufactured by Nippon Denkai, Ltd.) was laid on each outer side of the glass woven fabric prepregs, and was molded by applying heat and pressure at 150° C. and 10 MPa for 120 minutes. Thus, a laminate having a thickness of 1.6 mm was obtained.

Example 2

Example 2 was conducted similarly as Example 1 except that the compounding amount of the second phenolic resin coating liquid impregnated into the glass woven fabric was changed as below.

75 parts by weight (18.1% based on solid content) of the above unmodified resol-based phenolic resin varnish, 150 parts by weight (36.1%) of the above oil-modified resol-based phenolic resin varnish, 50 parts by weight (12.0%) of the above novolac-based phenolic resin varnish, 30 parts by weight (14.5%) of brominated epoxy (product name: GX-153; manufactured by DIC Corporation), 20 parts by weight (9.6%) of triphenyl phosphate (TPP; manufactured by Daihachi Chemical Industry Co., Ltd.) and 20 parts by weight (9.6%) of a methylolized melamine resin (product name: PHENOLITE TD-2538; manufactured by DIC Corporation) were compounded. Thus, a second phenolic resin coating liquid was obtained.

Example 3

Example 3 was conducted similarly as Example 1 except that glass nonwoven fabric was used as the glass fiber substrate.

Comparative Example 1

Comparative example 1 was conducted similarly as Example 1 except that an epoxy resin coating liquid prepared as below was used instead of the first and second phenolic resin coating liquids impregnated into the substrate, and further a copper foil not containing an adhesive was used.

20 parts by weight (15.9% based on solid content) of the above novolac-based phenolic resin varnish, 100 parts by weight (79.4%) of brominated epoxy (product name: GX-153; manufactured by DIC Corporation), 5 parts by weight (4.0%) of triphenyl phosphate (TPP; manufactured by Daihachi Chemical Industry Co., Ltd.) and 1 part by weight (0.8%) of imidazole (product name: 2P4MZ; manufactured by Shikoku Chemicals Corporation) were compounded. Further, 50 parts by weight of aluminium hydroxide was compounded. Thus, a first and second epoxy resin coating liquid was obtained.

Comparative Example 2

Comparative example 2 was conducted similarly as Example 1 except that an epoxy resin coating liquid prepared as below was used instead of the first and second phenolic resin coating liquids impregnated into the substrate, and four paper base prepregs were layered as the core material, two glass fiber substrate prepregs were layered on each of the upper and lower sides of the core material, and a copper foil not containing an adhesive was used.

20 parts by weight (15.9%) of the above novolac-based phenolic resin varnish, 100 parts by weight (79.4%) of brominated epoxy (product name: GX-153; manufactured by DIC Corporation), 5 parts by weight (4.0%) of triphenyl phosphate (TPP; manufactured by Daihachi Chemical Industry Co., Ltd.) and 1 parts by weight (0.8%) of imidazole (product name: 2P4MZ; manufactured by Shikoku Chemicals Corporation) were compounded. Further, 50 parts by weight of aluminium hydroxide was compounded. Thus, a first and second epoxy resin coating liquid was obtained.

Comparative Example 3

Comparative example 3 was conducted similarly as Example 1 except that an epoxy resin coating liquid prepared as below was used instead of the first and second phenolic resin coating liquid impregnated into the substrate.

20 parts by weight (15.9%) of the above novolac-based phenolic resin varnish, 100 parts by weight (79.4%) of brominated epoxy (product name: GX-153; manufactured by DIC Corporation), 5 parts by weight (4.0%) of triphenyl phosphate (TPP; manufactured by Daihachi Chemical Industry Co., Ltd.) and 1 part by weight (0.8%) of imidazole (product name: 2P4MZ; manufactured by Shikoku Chemicals Corporation) were compounded. Further, 50 parts by weight of aluminium hydroxide was compounded. Thus, a first and second epoxy resin coating liquid was obtained.

Comparative Example 4

Comparative example 4 was conducted similarly as Example 1 except that an epoxy resin coating liquid prepared as below was used instead of the second phenolic resin coating liquid impregnated into the glass fiber substrate, and further a copper foil not containing an adhesive was used.

20 parts by weight (15.9%) of the above novolac-based phenolic resin varnish, 100 parts by weight (79.4%) of brominated epoxy (product name: GX-153; manufactured by DIC Corporation), 5 parts by weight (4.0%) of triphenyl phosphate (TPP; manufactured by Daihachi Chemical Industry Co., Ltd.) and 1 part by weight (0.8%) of imidazole (product name: 2P4MZ; manufactured by Shikoku Chemicals Corporation) were compounded. Further, 50 parts by weight of aluminium hydroxide was compounded. Thus, a second epoxy resin coating liquid was obtained.

Comparative Example 5

Comparative example 5 was conducted similarly as Example 1 except that an epoxy resin coating liquid prepared as below was used instead of the first phenolic resin coating liquid impregnated into the paper base, and further a copper foil not containing an adhesive was used.

20 parts by weight (15.9%) of the above novolac-based phenolic resin varnish, 100 parts by weight (79.4%) of brominated epoxy (product name: GX-153; manufactured by DIC Corporation), 5 parts by weight (4.0%) of triphenyl phosphate (TPP; manufactured by Daihachi Chemical Industry Co., Ltd.) and 1 part by weight (0.8%) of imidazole (product name: 2P4MZ; manufactured by Shikoku Chemicals Corporation) were compounded. Further, 50 parts by weight of aluminium hydroxide was compounded. Thus, a first epoxy resin coating liquid was obtained.

Comparative Example 6

Comparative example 6 was conducted similarly as Example 1 except that paper bases were used for all substrates.

Comparative Example 7

Comparative example 7 was conducted similarly as Comparative example 3 except that paper bases were used for all substrates, and further a copper foil not containing an adhesive was used.

Properties of laminates obtained by the above Examples and Comparative examples were evaluated. The properties were evaluated by the following methods. The obtained results are shown in Table 1.

(1) Transverse Strength

The transverse strength was evaluated in accordance with JIS C 6481.

(2) Water Absorption Rate

The water absorption rate was evaluated in accordance with JIS C 6481.

(3) Long-Term Hygroscopicity

A form of a sample was adjusted in accordance with a measurement of water absorption rate in JIS C 6481. A sample of 50×50 mm square was cut out, and all copper foil was removed. The initial weight of the sample was weighed after pretreatment at 50° C. for 24 hours. The sample was left in a constant temperature and humidity bath of 60° C. and 90% for 1,000 hours. The sample was taken out from the bath and left under environment of 20° C. and 65% for 30 minutes. Then, the sample was weighed within 30 minutes, and the moisture absorption rate was calculated from the difference of weight.

(4) Insulating Property Between Through Holes Filled with Silver Paste

The land diameter of the copper foil was set to φ0.75 mm, and drill processing was performed using a drill of φ0.5 mm so that the through-hole pitch was 1.5 mm. Silver paste was printed on through holes and cured. Electric continuity was taken between upper and lower sides, and a printed board for insulating property test of through holes filled with silver paste was formed.

The voltage of 50 V was applied on the substrate. Then, the substrate was left in a constant temperature and humidity bath of 40° C. and 90% for 1,000 hours. The substrate was taken out from the bath and the voltage of 100 V was applied. Thereby, the insulation resistance value of through holes was measured.

(5) Tracking Resistance

Tracking resistance was evaluated in accordance with UL-1410.

(6) Tracking Resistance of Copper Foil Circuits

Copper foil circuits having a circuit width of 1 mm, a circuit length of 30 mm and a circuit void of 1 mm were produced, and evaluated in accordance with UL-1410.

TABLE 1

| | | Example 1 | Example 2 | Example 3 | Comp. Example 1 | Comp. Example 2 | Comp. Example 3 | Comp. Example 4 | Comp. Example 5 | Comp. Example 6 | Comp. Example 7 |
|---|---|---|---|---|---|---|---|---|---|---|---|
| Layer constitution | Upper-side copper foil | with adhesion | with adhesion | with adhesion | without adhesion | without adhesion | with adhesion | without adhesion | without adhesion | with adhesion | without adhesion |
| | Upper-side portion | GC/Phe1 | GC/Phe2 | Nonwoven/Phe1 | GC/Ep | GC×2/Ep | GC/Ep | GC/Ep | GC/Phe1 | Paper/Phe1 | Paper/Ep |
| | Core | Paper×6/Phe1 | Paper×6/Phe1 | Paper×6/Phe1 | Paper×6/Ep | Paper×4/Ep | Paper×6/Ep | Paper×6/Phe1 | Paper×6/Ep | Paper×6/Phe1 | Paper×6/Ep |
| | Lower-side portion | GC/Phe1 | GC/Phe2 | Nonwoven/Phe1 | GC/Ep | GC×2/Ep | GC/Ep | GC/Ep | GC/Phe1 | Paper/Phe1 | Paper/Ep |
| | Lower-side copper foil | with adhesion | with adhesion | with adhesion | without adhesion | without adhesion | with adhesion | without adhesion | without adhesion | with adhesion | without adhesion |
| Transverse strength (N/mm$^2$) | | 340 | 320 | 300 | 330 | 390 | 330 | 330 | 340 | 150 | 190 |
| Water absorption rate (%) | | 0.17 | 0.19 | 0.18 | 0.13 | 0.11 | 0.13 | 0.13 | 0.15 | 0.80 | 0.32 |
| Long-term moisture absorption rate (%) | | 1.03 | 1.04 | 1.15 | 2.83 | 2.53 | 2.85 | 1.05 | 2.91 | 2.20 | 3.20 |
| Insulation resistance value between silver paste through holes (Ω) | | $5 \times 10^{10}$ | $3 \times 10^{10}$ | $1 \times 10^{10}$ | $9 \times 10^{7}$ | $1 \times 10^{8}$ | $9 \times 10^{7}$ | $3 \times 10^{10}$ | $9 \times 10^{7}$ | $1 \times 10^{9}$ | $9 \times 10^{7}$ |
| Tracking resistance (V) | | 600 | 600 | 600 | 600 | 600 | 600 | 600 | 600 | 600 | 300 |

TABLE 1-continued

| | Example 1 | Example 2 | Example 3 | Comp. Example 1 | Comp. Example 2 | Comp. Example 3 | Comp. Example 4 | Comp. Example 5 | Comp. Example 6 | Comp. Example 7 |
|---|---|---|---|---|---|---|---|---|---|---|
| Tracking resistance between copper foil circuits (V) | 260 | 280 | 280 | 50 | 50 | 75 | 50 | 75 | 260 | 50 |

Paper: paper base
GC: glass substrate
Nonwoven: glass nonwoven fabric
Phe1: phenolic resin composition prepared in Example 1
Phe2: phenolic resin composition prepared in Example 2
Ep: epoxy resin composition prepared in Comparative example 1

As is obvious from the table, Examples 1 to 3 were excellent in transverse strength, water absorption rate, long-term moisture absorption rate, electric insulation and tracking resistance between copper foil circuits.

Comparing Examples 1 to 3 and Comparative examples 6 and 7, the transverse strength and the water absorption rate were exhibited by laying the outer portion using the glass fiber substrate prepreg on each side of the core material using the paper base prepreg.

Comparing Examples 1 to 3 and Comparative examples 1 to 3, 5 and 7, the long-term moisture resistance and the electric insulation were exhibited by impregnating the paper base with the phenolic resin liquid.

Also, comparing Examples 1 to 3 and Comparative examples 1 to 4 and 7, the tracking resistance between copper foil circuits was exhibited by impregnating the glass fiber substrate of the outer portion with the phenolic resin liquid, and using the copper foil with the adhesive.

From the above, the laminate for printed circuit having a combination of transverse strength, water absorption rate, long-term moisture absorption rate, electric insulation and tracking resistance between copper foil circuits can be obtained by laying the glass fiber substrate prepreg, which is the glass fiber substrate impregnated with the phenolic resin coating liquid, on the upper and the lower sides of the core material using the paper base prepreg, which is the paper base impregnated with the phenolic resin coating liquid, and further forming the lamination having the metal foil layered on at least one side by applying heat and pressure. Also, preferably by using the metal foil with the adhesive, the metal-clad phenolic resin laminate disposing the surface with the adhesive and the surface of the glass fiber substrate prepreg to face each other can be obtained.

The invention claimed is:

1. A metal-clad phenolic resin laminate obtained by heating and pressing a lamination which comprises:
   (i) a central portion comprising one or a plurality of paper base prepregs, each of which is made of a paper base impregnated with a first phenolic resin composition, wherein said paper base is selected from the group consisting of kraft paper, linter paper, pretreated kraft paper with a water-soluble phenolic resin or a methylol melamine resin, and pretreated linter paper with a water-soluble phenolic resin or a methylol melamine resin;
   (ii) outer portions laid on upper and lower sides of the central portion, in which each of the outer portions comprises one or a plurality of glass fiber substrate prepregs, each of which is made of a glass fiber substrate impregnated with a second phenolic resin composition; and
   (iii) a metal foil laid on one or both of the outer portions;

wherein each of the first phenolic resin composition and the second phenolic resin composition contains an unmodified resol-based phenolic resin, a novolac-based phenolic resin, an oil-modified resol-based phenolic resin, and one or more flame-retardant compounds selected from the group consisting of a halogen compound, a phosphorous compound and an amino resin, a total amount of the unmodified resol-based phenolic resin and the oil-modified resol-based phenolic resin is 30 to 60 wt %, an amount of the novolac-based phenolic resin is 5 to 20 wt %, and an amount of the oil-modified resol-based phenolic resin is 10 to 40 wt %, with respect to the total amount (based on solid content) of the phenolic resin composition, an amount of the flame-retardant compound is 5 to 36 wt % with respect to the total amount (based on solid content) of the phenolic resin composition, and a long-term moisture absorption rate of said central and outer portions after the metal foil is removed from the metal-clad phenolic resin laminate in accordance with JIS C6481, and being left under an environment of 60° C. and 90% relative humidity for 1,000 hours and left under an environment of 20° C. and 65% for 30 minutes, is 2 wt % or less.

2. The metal-clad phenolic resin laminate according to claim 1, wherein the metal foil of the laminate is a metal foil with an adhesive on one surface, and the surface of the metal foil with the adhesive and the glass fiber substrate prepreg are disposed to face each other.

3. The metal-clad phenolic resin laminate according to claim 1, wherein the glass fiber substrate is made of glass woven fabric.

4. The metal-clad phenolic resin laminate according to claim 1, wherein the first phenolic resin composition and the second phenolic resin composition are the same resin composition.

5. The metal-clad phenolic resin laminate according to claim 1, wherein the flame-retardant compound is one or more flame-retardant compounds selected from the group consisting of tetrabromobisphenol A (TBBA), TBBA-epoxy oligomer, triphenyl phosphate, tricresyl phosphate, cresyl diphenyl phosphate and a melamine resin.

6. The metal-clad phenolic resin laminate according to claim 1, wherein the first phenolic resin composition and the second phenolic resin composition contain no cross-linking agent other than the phenolic resin.

7. The metal-clad phenolic resin laminate according to claim 1, wherein the amount of the novolac-based phenolic resin is 12 to 20 wt %.

* * * * *